United States Patent [19]
Liou

[11] Patent Number: 5,517,517
[45] Date of Patent: May 14, 1996

[54] SEMICONDUCTOR LASER HAVING INTEGRATED WAVEGUIDING LENS

[75] Inventor: Kang-Yih Liou, Holmdel, N.J.

[73] Assignee: AT&T Corp., Murray Hill, N.J.

[21] Appl. No.: 268,896

[22] Filed: Jun. 30, 1994

[51] Int. Cl.$^6$ ..................................................... H01S 3/19
[52] U.S. Cl. ............................ 372/50; 372/101; 372/19; 372/92
[58] Field of Search ................................. 372/50, 101, 19, 372/92, 44

[56] References Cited

U.S. PATENT DOCUMENTS

| | | | |
|---|---|---|---|
| 4,667,331 | 5/1987 | Alferness et al. | 372/92 |
| 4,794,608 | 12/1988 | Fujita et al. | 372/50 |
| 4,815,084 | 3/1989 | Scifres et al. | 372/46 |
| 4,935,939 | 6/1990 | Liau et al. | 372/98 |
| 5,003,550 | 3/1991 | Welch et al. | 372/50 |
| 5,115,444 | 5/1992 | Kirkby et al. | 372/50 |
| 5,228,049 | 7/1993 | Paoli | 372/50 |
| 5,260,822 | 11/1993 | Missaggia et al. | 359/337 |

OTHER PUBLICATIONS

"Aspheric waveguide lenses for photonic integrated circuits," J. M. Verdiell et al., *Applied Physics Letters*, vol. 62, No. 8 22 Feb. 1993, pp. 808–810.

"High Power, Strained–Layer Amplifiers and Lasers with Tapered Gain Regions," E. S. Kintzer et al., *IEEE Photonics Technology Letters*, vol. 5, No. 6, Jun. 1993, pp. 605–608.

"High Temperature Operation of InGaAs Strained Quantum–Well Lasers," R. J. Fu et al., *IEEE Photonics Technology Letters*, vol. 3, No. 4, Apr. 1991, pp. 308–310.

Patent application Ser. No. 08/368479, filed on Jun. 30, 1994 by K. Liou, entitled "Semiconductor Amplifier Or Laser Having Integrated Lens," and which was allowed on Apr. 4, 1995. Comment: Technological background of the invention.

S. O'Brien et al., "1.3 W CW, diffraction–limited monolithically integrated master oscillator flared amplifier at 863 nm," Electronics Letters, vol. 29, No. 24, 25 Nov. 1993, pp. 2109–2110. Technological background of the invention.

E. S. Kintzer et al., "High–Power, Strained–Layer Amplifiers and Lasers with Tapered Gain Regions," IEEE Photonics Technology Letters, vol. 5, No. 6, Jun. 1993, pp. 605–608. Technological background of the invention.

*Primary Examiner*—Rodney B. Bovernick
*Assistant Examiner*—Yisun Song
*Attorney, Agent, or Firm*—Stuart H. Mayer

[57] ABSTRACT

A semiconductor laser has been developed which is capable of efficiently transmitting a predetermined number of modes to an external fiber or waveguide. The laser includes an active gain region disposed in a laser cavity that is formed in a semiconductor material. A lens and a waveguide are also located in the laser cavity. The lens receives optical energy generated by the active gain region and directs this energy into one end of the waveguide. The waveguide transmits the optical energy from the laser to an external fiber or waveguide. The waveguide may be either a single mode waveguide or a multimode waveguide that selects a predetermined number of modes from among all the modes generated by the active region. If a single mode waveguide is employed, the output energy is composed of the fundamental frequency generated by the active region. If a multimode waveguide is employed, the output energy is composed of the predetermined modes selected by the waveguide.

16 Claims, 2 Drawing Sheets

| ELECTRODE 18 |
| --- |
| CLADDING LAYER 12 |
| ACTIVE WAVEGUIDE REGION 16 |
| CLADDING LAYER 14 |

| ELECTRODE 17 | |
| --- | --- |
| CLADDING LAYER 15 | p-InGaP |
| ACTIVE LAYER 13 | GaAs/InGaAs |
| PASSIVE WAVEGUIDE LAYER 11 | GaAs |
| CLADDING LAYER 10 | n-AlGaAs |

SEMICONDUCTOR LASER HAVING INTEGRATED WAVEGUIDING LENS

TECHNICAL FIELD

This invention relates generally to semiconductor lasers and more particularly to semiconductor lasers having an integrated waveguide lens.

BACKGROUND OF THE INVENTION

Optical systems and circuits require a variety of devices incorporating optical structures. For example, high capacity optical communication systems which transmit information over networks composed of optically transmissive nodes, fibers, waveguides, and the like require a high power source of optical energy that is monochromatic and spatially coherent. An ideal source for producing such optical energy is a semiconductor laser.

One known type of semiconductor laser is a broad-area semiconductor laser, which has an increased lateral dimension allowing the laser to provide a high output power. Examples of such lasers are disclosed in Fu et al., "High-Temperature Operation of InGaAs Strained Quantum-Well Lasers," *IEEE Photonics Technology Letters*, vol. 3, No. 4, p. 308, 1991, and J. N. Walpole et al., "High power tapered semiconductor amplifiers and lasers at 980 nm," in *Proc. Conf. IEEE/LEOS Annu. Meeting*, Boston, Mass., paper PD2, Nov. 1992. Broad-area lasers provide a number of advantages over other types of semiconductor lasers. For example, in addition to providing high output power, such lasers provide high reliability and a simple structure that is relatively easy to fabricate. However, a significant drawback associated with broad-area lasers is that there is no provision for the lateral confinement of the optical energy and thus known broad-area semiconductor lasers are characterized by output energies that lack a high degree of spatial coherence. Moreover, the relatively large lateral dimension of the device makes it difficult to efficiently couple the optical output to an external device such as a waveguide. As a result of these deficiencies, broad-area lasers have to date not been used in communication systems but are typically employed simply to characterize various materials or to provide a high brightness source of light.

Accordingly, it is an object of the invention to provide a semiconductor laser such as a broad-area laser whose optical output exhibits a high degree of spatial coherence and which can be efficiently coupled to an external waveguide or fiber so that it may be employed in an optical communications system.

SUMMARY OF THE INVENTION

In accordance with this invention a semiconductor laser has been developed which is capable of efficiently transmitting a predetermined number of modes to an external fiber or waveguide. In one embodiment of the invention the laser includes an active gain region disposed in a laser cavity that is formed in a semiconductor material. A lens and a waveguide are also located in the laser cavity. The lens receives optical energy generated by the active gain region and directs this energy into one end of the waveguide. The waveguide transmits the optical energy from the laser to an external fiber or waveguide.

The waveguide may be either a single mode waveguide or a multimode waveguide that selects a predetermined number of modes from among all the modes generated by the active region. If a single mode waveguide is employed, the output energy is composed of the fundamental frequency generated by the active region. If a multimode waveguide is employed, the output energy is composed of the predetermined modes selected by the waveguide.

In certain embodiments of the invention the active region is rectangular or tapered in shape. Regardless of the shape employed, the lens may be configured so that the optical energy passing therethrough is diffracted to substantially fill the active region. The lens also may be configured so that the optical energy is focused into one end of the waveguide.

BRIEF DESCRIPTION OF THE DRAWINGS

FIGS. 2(*a*) and 2(*b*) show cross-sectional views of known active regions employed in semiconductor lasers.

DETAILED DESCRIPTION

Figures 1, 2A, 2B:
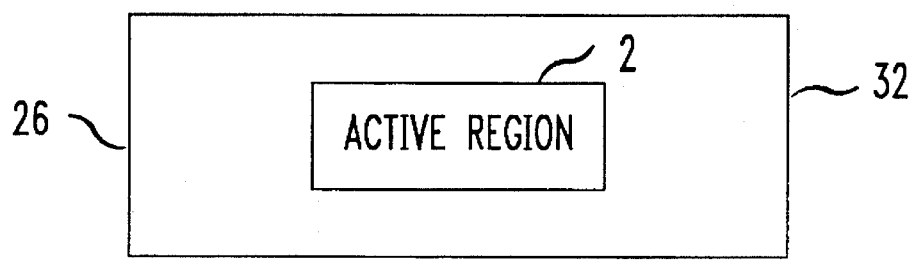
FIGS. 1 shows a simplified schematic plan view of a known semiconductor laser having an active region disposed in a laser cavity.

A semiconductor laser in its simplest form is a forward-biased, heavily doped p-n junction fabricated from a direct-gap semiconductor material. Optical feedback is provided by reflective surfaces which are usually obtained by cleaving the semiconductor material along its crystal planes to form an optical resonator. The p-n junction is formed within the optical resonator and serves as the active medium for generating optical energy. One class of semiconductor lasers typically employs a semiconductor heterostructure that is formed from more than one semiconductor material such as gallium arsenide (GaAs) and aluminum gallium arsenide (AlGaAs). Semiconductor heterostructure lasers are made from a combination of semiconductor materials which have different bandgap energies to achieve electrical carrier confinement as well as different optical indices of refraction to achieve optical confinement. FIG. 1 shows a plan view of a semiconductor laser which has an active region 2 disposed in a semiconductor cavity formed between reflective facets 26 and 32.

In general, the semiconductor laser may be composed of any direct-band gap semiconductor ternary or quaternary alloy system whose various alloys can be selected to have lattice constants close to that of the substrate crystal, which may be, for example, GaAs or InP. Material systems for fabricating the semiconductor laser of the invention include, for example, InGaAsP/InP, GaAs/AlGaAs, GaAs/AlAs, InGaAs/InAlAs, InGaAs/InGaAlAs, and GaAsSb/GaAlAsSb. Moreover, mismatching is also contemplated wherein active regions comprising strained layers are grown over the substrate material. Finally, extension of the device structures is also contemplated to include semiconductor compounds in Group II-VI.

One example of the active region of a heterostructure laser is composed of three layers of semiconductor material, as shown in FIG. 2(*a*). A p-type material 12 having a relatively high bandgap and an n-type material 14 also having a relatively high bandgap form the cladding layers of the device. The cladding layers 12 and 14 may be composed of AlGaAs, for example. The active waveguide layer 16, which defines the waveguide core, is sandwiched between the cladding layers 12 and 14 and is formed from a relatively low bandgap material such as GaAs or a more complex multiple layer sequence. An electrode 18 such as AuZn/Au is deposited over the cladding layer 12. A contact layer composed of p$^+$-type GaAs, for example, may be interposed between the electrode 18 and the cladding layer 12 to enhance electrical conductivity.

Another example of the active region of a heterostructure laser is composed of four semiconductor layers and is shown in FIG. 2(b). The cladding layers 15 and 10 are composed of relatively high bandgap materials such as n-type AlGaAs and p-type InGaP, for example. Sandwiched between the cladding layers 10 and 15 are a passive waveguide layer 11 and an active layer 13 adjacent thereto. The passive waveguide layer 11 and the active layer 13 together define the waveguide core of the device. The passive waveguide layer 11 is formed from an undoped material such as GaAs, which has a bandgap energy higher than the bandgap of the active layer 13 but lower than the bandgap of the cladding layers 10 and 15. The active layer 13 is formed from a material which may have a composite multilayer configuration such as a GaAs/InGaAs multiple quantum well structure, for example. As with the composition seen in FIG. 2(a), an electrode 17 is deposited on the cladding layer 15 and a contact layer may be interposed therebetween.

Figure 3:
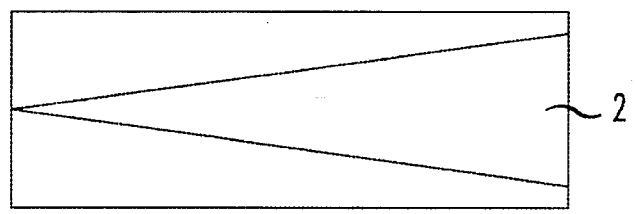
FIG. 3 shows a plan view of a known tapered optical amplifier.

Many types of semiconductor lasers based on the above-described layer structures are known for providing high-power, continuous-wave operation. One such type is a broad-area laser, which is characterized by a lateral dimension of about a few tens to a few hundred microns. This dimension is about 10–100 greater than the lateral dimension of a conventional single transverse-mode semiconductor laser. The active region of a broad-area laser may be rectangular in shape such as shown in FIG. 1 or it may have a tapered shape in which the width of the active region increases exponentially or linearly along the direction of light propagation such as shown in FIG. 3. The shape of the active region, whether rectangular or tapered, may be defined by providing a patterned dielectric layer on top of the laser wafer. For example, the tapered active region may be formed by depositing a layer of SiO$_2$ over the entire laser structure prior to deposition of the electrode. A portion of the oxide layer defining a taper is then removed. After this portion of the oxide is removed the electrode is deposited so that electrical contact is formed only between the tapered, exposed portion of the surface and the remainder of the device.

Rather than defining the taper with a patterned dielectric layer, the tapered shape may be achieved by simply depositing the active layer material only on a portion of the laser structure which is tapered in shape. The remainder of the structure in the plane of the active layer then may be formed from a semiconductor material having a high electrical resistance. In this case the layer above this high resistance material, which would otherwise form part of the cladding layer, is also composed of a high resistance semiconductor material.

Figure 4:
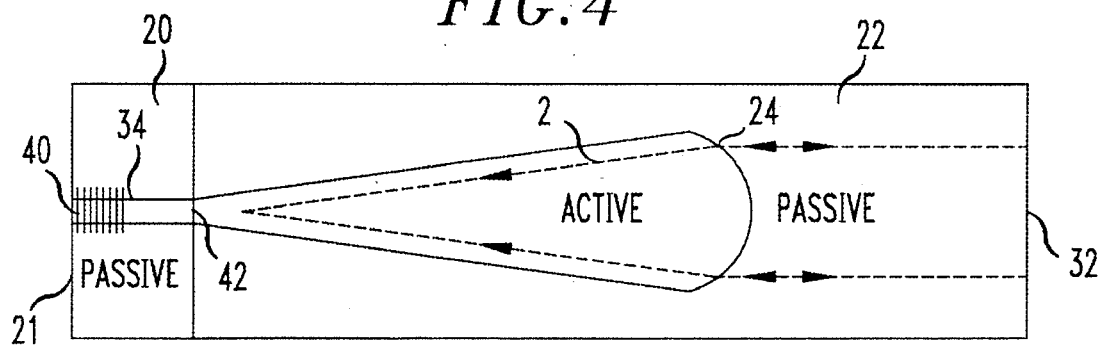
FIG. 4 shows a plan view of a semiconductor laser constructed in accordance with this invention.

FIG. 4 shows a semiconductor laser in accordance with this invention. The laser is composed of an active region 2, passive regions 20 and 22, a lens 24 and a single mode waveguide 34. While the active region 2 in the embodiment of the invention shown in FIG. 4 has a tapered shape, the active region may be provided with any shape that is desired. The active region 2, lens 24, and single mode waveguide 34 are all integrated on the same substrate and are formed in a laser cavity defined by reflective surfaces 21 and 32. The reflective surfaces 21 and 32 may be enhanced by thin film coatings, if desired.

The passive regions 20 and 22 are regions through which optical energy can propagate without supplying increased gain to the optical energy. If the laser employs an active region 2 having a structure such as shown in FIG. 2(b), the passive regions 20 and 22 may be similar in structure except that the active layer 13 is removed and the cladding layer 15 is grown separately from the cladding layer in the active region. Alternatively, the passive regions 20 and 22 may comprise a multilayer waveguide structure that is grown independently from the active region 2 but on the same substrate. In this case the cores of the passive regions 20 and 22 are connected to the active waveguide layer 16 in FIG. 2(a) by butt-joining. The cladding layers in the passive regions 20 and 22 may be either doped or undoped. Undoped cladding layers can reduce the waveguide propagation loss in the passive regions.

In the embodiment of the invention shown in FIG. 4, the lens 24 is formed in the active region 2 at the boundary between the active region 2 and the passive region 22. The single mode waveguide 34 is integrated within the laser cavity so that it has a first end 40 coupled to one of the facets defining the waveguide cavity and a second end 42 positioned at the focal point of the lens 24, as indicated by the optical rays shown in FIG. 4. The first end 40 of the waveguide 34 serves as the output for the laser through which optical energy can be transmitted, for example, to another waveguide or fiber located external to the laser.

As disclosed in Verdiell et al., *Appl. Phys. Lett* 62 (8), 1993, which is hereby incorporated by reference, a lens may be formed in a planar waveguide by changing the thickness of the waveguide layer to produce a change in the effective index of refraction. In the embodiment of the invention shown in FIG. 4, the refractive index difference for the lens is produced by the difference in the core thickness between the active region 2 and the passive region 22. This change in thickness results from the absence of the active layer 13 in the passive region 22 so that the core is composed only of the passive waveguide layer 11. The shape of the lens may be designed by the conventional ray tracing method or by the beam propagation calculation.

In operation the active region 2 generates optical energy above a lasing threshold which resonates within the laser cavity defined by the facets 21 and 32. The lens 24 focuses optical energy that is reflected from the facet 32 so that the energy arrives at the second end 42 of the single mode waveguide 34, which is located at the focal point of the lens 24. As explained below, the single mode waveguide 34 serves as a mode stabilizer that selects the fundamental mode from among all the modes generated by the active region 2.

The single mode waveguide 34 confines only the fundamental mode generated by the active region 2 and not the higher order transverse modes that are also generated by the active region 2. These higher modes therefore have a poor coupling efficiency between the reflecting facets 21 and 32 and thus only the fundamental mode can oscillate between the two facets with low loss. Accordingly, the fundamental mode is selected out from among all the modes in the cavity because the fundamental mode has the lowest lasing threshold. The single mode waveguide 34 thus selects the fundamental mode resonating within the laser cavity and couples this mode to an external waveguide.

Figure 5:
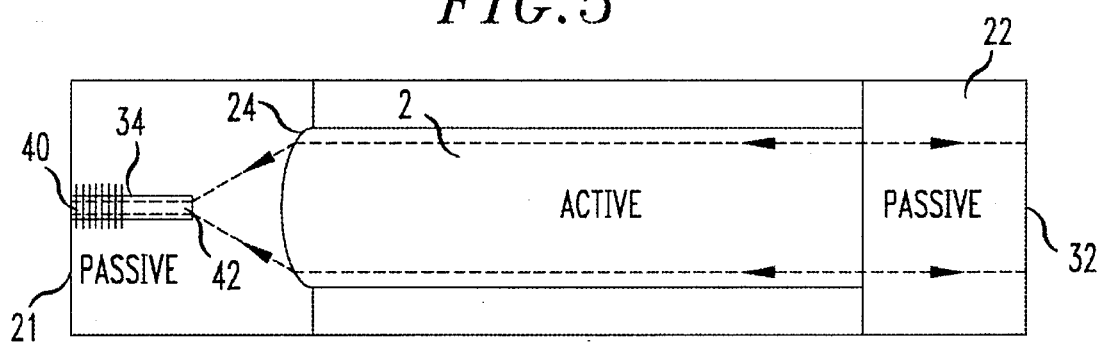
FIGS. 5 and 6 each show alternative embodiments of the semiconductor laser of this invention.

FIG. 5 shows an alternative embodiment of the invention in which the active region 2 has a substantially rectangular shape rather than a tapered shape as in FIG. 4. In this case the lens 24 is positioned on the same side of the active region 2 as the single mode waveguide 34. The second end 42 of the single mode waveguide 34 is positioned at a focal point of the lens 24, similar to the embodiment of the invention shown in FIG. 4. Optical energy propagating from the focal point of the lens 24 is transmitted through the lens so that the optical energy is reflected from the facet 32 in a substantially perpendicular direction. Similar to the embodiment of the invention shown in FIG. 4, in this embodiment the single mode waveguide 34 selects the fundamental mode of the optical energy generated by the active region.

As one of ordinary skill in the art will recognize from the above discussion of FIGS. 4 and 5, the optimal location and shape of the lens 24 within the laser cavity is determined by the shape of the active region 2. In particular, the lens 24 is configured so that optical energy propagating therethrough will be diffracted to substantially fill the active region 2. Accordingly, the present invention contemplates a great variety of lasers with differently shaped active regions and different lens configurations and hence the invention is not limited to the configurations shown in the figures. Of course, certain embodiment will provide advantageous features not available in other embodiments. For example, in the embodiment of the invention shown in FIG. 4 the optical intensity is not a constant throughout the active region and thus saturation occurs in a non-uniform manner. Accordingly, the optical gain is not uniform throughout the active region because of the effects of saturation. In contrast, in the embodiment shown in FIG. 5 the optical intensity is constant throughout the active region and thus the gain is uniform therethrough.

Figure 6:
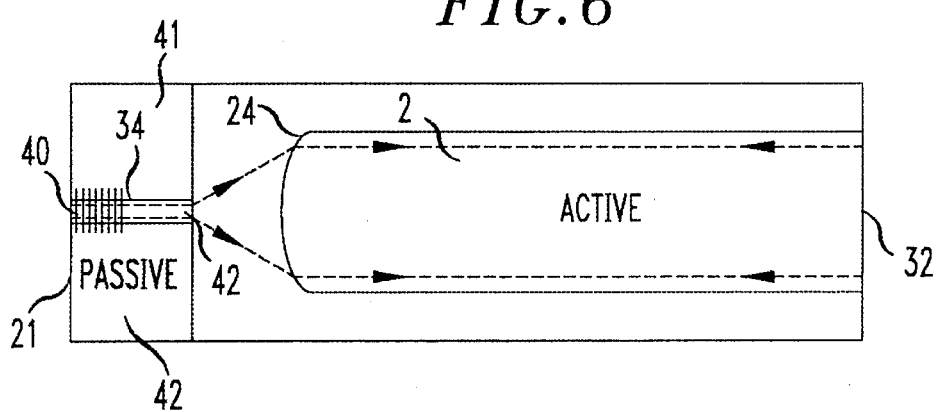

In the embodiment of the invention shown in FIG. 5, a passive region 22 is interposed between the active region 2 and the facet 32 on the side of the active region 2 remote from the lens 24. FIG. 6 shows an alternative embodiment of the invention in which the active region 2 directly abuts the facet 32, thus eliminating the passive region 22. Also shown in FIG. 6 are regions 41 and 42 in which the passive waveguide layer 11 is completely removed to further suppress back reflections of higher order modes that are not selected by the passive waveguide 34. Such removal of the passive waveguide layer 11 may be employed in the embodiments of the invention shown in FIGS. 4–5 as well as in the embodiment of the invention shown in FIG. 6.

In another alternative embodiment of the invention, the lens may be placed within either the active region 2 or the passive region 22 rather than at the boundary therebetween. In these embodiments the change in refractive index may be accomplished by varying the thickness of the active layer and/or the passive waveguide layer at the location defining the lens.

The laser of the present invention may be fabricated by a two-step MOVPE process. However, other processes may be employed, such as multiple step LPE, MBE or CBE, for example. In one embodiment of the invention, the structure is composed of a 0.8 micron thick n-type $Al_{0.5}$ GaAs bottom cladding layer 10 deposited on an $n^+$-GaAs substrate. A 0.2 micron undoped GaAs layer forms the passive waveguide layer 11 seen in FIG. 2(b). A thin InGaP stop etch layer is deposited on the passive waveguide layer 11. The active layer 13 is composed of a 500 angstrom GaAs bottom barrier layer, three 40 angstrom compressively strained $In_{0.3}Ga_{0.7}As$ quantum wells with 80 angstrom GaAs barriers and a 700 angstrom GaAs top barrier layer. A 1 micron $p^+$-type InGaP layer forms the top cladding layer 15, over which is deposited a p-type GaAs contact layer. The cladding layer 15 and the active layer 13 are etched away from a section of the structure to define the passive regions 20 and 22. While the passive region 22 is being formed, the lens is defined by wet chemical etching and is configured to have a shape determined by one of the methods mentioned above. The single mode waveguide is fabricated in the passive region where the cladding layer 15 and the active layer 13 have been removed. The waveguide layer 11 seen in FIG. 2(b) is then partially etched to form a narrow (e.g., about 2 microns) strip rib-loaded waveguide. Other waveguide structures may serve as a single mode waveguide, including buried heterostructures or ridge waveguides, for example. Subsequent to the formation of the lens and single mode waveguide, a 1.2 micron thick undoped InGaP layer is deposited in a second MOVPE step to form the cladding layer 15 in the passive regions 20 and 22. This undoped InGaP layer is etched away from the amplifying active section 2.

The present invention has been described in terms of a semiconductor laser that incorporates a single mode waveguide for selecting the fundamental mode generated by the active region.. One of ordinary skill in the art will recognize that the invention is not limited to the use of a waveguide that selects a single mode but rather may employ a waveguide that selects a predetermined number of modes from among all the modes generated by the active region. For example, it may be advantageous to provide a waveguide that can select the first ten or even the first hundred modes.

In operation, the output from the laser of the present invention may be taken from either the side adjacent waveguide 34 or the broad area side adjacent to facet 32. The output from the side adjacent to passive waveguide 34 can be used for coupling to an external waveguide or fiber while the output from the broad area side can be advantageously used for free space applications.

In an alternative embodiment of the invention, a grating may be fabricated in the passive waveguide region 34 to provide a distributed Bragg reflector laser. Moreover, rather than a monolithic integrated device, this same structure may be fabricated as a hybrid Bragg reflector laser in which the grating is fabricated in an external single mode fiber that is optically coupled via an external lens to an antireflective-coated facet of a conventional broad area laser such as shown in FIG. 1.

I claim:

1. A monolithic semiconductor structure comprising:

a substrate having opposing reflective surfaces defining a laser cavity therebetween, said cavity having an active gain region and a passive region;

a bottom cladding layer, a core layer and a top cladding layer all formed from semiconductor materials and disposed on said active gain region and said passive region of the substrate, the portion of the core layer in the active gain region including a semiconductor material for supplying gain to optical energy and the portion of the core layer in the passive region forming a passive waveguide layer that does not supply gain;

a lens having a prescribed shape and integrated on said substrate at a location such that optical energy propagating in the core layer passes through said lens; and a waveguide integrated on said substrate for receiving optical energy from said lens and for transmitting optical output power, wherein said lens has a focal point located substantially coincident with one end of said waveguide for transmitting optical energy into said waveguide.

2. The structure of claim 1 wherein said lens and said waveguide are located on a common side of said active gain region.

3. The structure of claim 1 wherein said lens and said waveguide are located on opposing sides of said active gain region.

4. The structure of claim 1 wherein said waveguide is a single mode waveguide.

5. A monolithic semiconductor structure comprising:

a substrate having opposing reflective surfaces defining a laser cavity therebetween, said cavity having an active gain region and a passive region;

a bottom cladding layer, a core layer and a top cladding layer all formed from semiconductor materials and disposed on said active gain region and said passive region of the substrate, the portion of the core layer in the active gain region including a semiconductor material for supplying gain to a series of optical energy modes and the portion of the core layer in the passive region forming a passive waveguide layer that does not supply gain;

a lens integrated on said substrate at a location such that optical energy propagating in the core layer passes through said lens; and a waveguide integrated on said substrate for receiving optical energy from said lens, wherein said waveguide selectively transmits as an optical output a subset of modes from among said series of optical energy modes, said subset of modes being capable of being coupled to an external optical fiber wherein said waveguide is a multimode waveguide for transmitting a predetermined number of modes.

6. The structure of claim 1 wherein said waveguide is a multimode waveguide for transmitting a predetermined number of modes.

7. A semiconductor laser comprising:

a laser cavity defined by opposing reflective surfaces formed in a semiconductor material;

an active gain region disposed in the laser cavity;

a lens for receiving optical energy generated by the active gain region;

a waveguide for receiving optical energy transmitted through the lens and for transmitting optical output energy, said lens and said waveguide being monolithically integrated on a common substrate and being located within said laser cavity, wherein said waveguide has a first end located at a focal point of the lens.

8. The laser of claim 7 wherein said active region has a tapered shape that increases in width along a propagation axis, said lens being located at a point along said propagation axis at which said width of the active gain region is a maximum, said waveguide being located on a side of said active region remote from said lens.

9. The laser of claim 8 wherein said waveguide is a multimode waveguide for transmitting a predetermined number of modes.

10. A monolithic semiconductor structure comprising:

a substrate having opposing reflective surfaces defining a laser cavity therebetween, said cavity having an active gain region and a passive region;

a bottom cladding layer, a core layer and a top cladding layer all formed from semiconductor materials and disposed on said active gain region and said passive region of the substrate, the portion of the core layer in the active gain region including a semiconductor material for supplying gain to a series of optical energy modes and the portion of the core layer in the passive region forming a passive waveguide layer that does not supply gain;

a lens integrated on said substrate at a location such that optical energy propagating in the core layer passes through said lens; and a waveguide integrated on said substrate for receiving optical energy from said lens, wherein said waveguide selectively transmits as an optical output a subset of modes from among said series of optical energy modes, said subset of modes being capable of being coupled to an external optical fiber, wherein said lens has a focal point located substantially coincident with one end of said waveguide for transmitting optical energy into said waveguide.

11. A monolithic semiconductor structure comprising:

a substrate having opposing reflective surfaces defining a laser cavity therebetween, said cavity having an active gain region and a passive region;

a bottom cladding layer, a core layer and a top cladding layer all formed from semiconductor materials and disposed on said active gain region and said passive region of the substrate, the portion of the core layer in the active gain region including a semiconductor material for supplying gain to a series of optical energy modes and the portion of the core layer in the passive region forming a passive waveguide layer that does not supply gain:

a lens integrated on said substrate at a location such that optical energy propagating in the core layer passes through said lens; and a waveguide integrated on said substrate for receiving optical energy from said lens, wherein said waveguide selectively transmits as an optical output a subset of modes from among said series of optical energy modes, said subset of modes being capable of being coupled to an external optical fiber, wherein said lens and said waveguide are located on opposing sides of said active gain region.

12. A semiconductor laser comprising:

a laser cavity defined by opposing reflective surfaces formed in a semiconductor material;

an active gain region disposed in the laser cavity;

a lens for receiving a series of optical energy modes generated by the active gain region;

a waveguide for receiving optical energy transmitted through the lens, said lens and said waveguide being monolithically integrated on a common substrate and being located within said laser cavity, wherein said waveguide selectively transmits as an optical output a subset of modes from among said series of optical energy modes, said subset of modes being capable of being coupled to an external optical fiber, wherein said waveguide has a first end located at a focal point of the lens.

13. A semiconductor laser comprising:

a laser cavity defined by opposing reflective surfaces formed in a semiconductor material;

an active gain region disposed in the laser cavity;

a lens for receiving a series of optical energy modes generated by the active gain region;

a waveguide for receiving optical energy transmitted through the lens, said lens and said waveguide being monolithically integrated on a common substrate and being located within said laser cavity, wherein said waveguide selectively transmits as an optical output a subset of modes from among said series of optical energy modes, said subset of modes being capable of being coupled to an external optical fiber, wherein said active region has a tapered shape that increases in width along a propagation axis, said lens being located at a point along said propagation axis at which said width of the active gain region is a maximum, said waveguide being located on a side of said active region remote from said lens.

14. A semiconductor laser comprising:

a laser cavity defined by opposing reflective surfaces formed in a semiconductor material;

an active gain region disposed in the laser cavity;

a lens disposed in the laser cavity for receiving optical energy generated by the active gain region;

a waveguide disposed in the laser cavity at a location external to said active gain region such that said waveguide receives optical energy transmitted through the lens and transmits an optical output beam wherein said lens has a focal point located substantially coincident with one end of said waveguide for transmitting optical energy into said waveguide.

15. A semiconductor laser comprising:

a laser cavity defined by opposing reflective surfaces formed in a semiconductor material;

an active gain region disposed in the laser cavity;

a lens disposed in the laser cavity for receiving optical energy generated by the active gain region;

a waveguide disposed in the laser cavity at a location external to said active gain region such that said waveguide receives optical energy transmitted through the lens and transmits an optical output beam, wherein said lens and said waveguide are located on opposing sides of said active gain region.

16. A semiconductor laser comprising:

a laser cavity defined by opposing reflective surfaces formed in a semiconductor material;

an active gain region disposed in the laser cavity;

a lens disposed in the laser cavity for receiving optical energy generated by the active gain region;

a waveguide disposed in the laser cavity at a location external to said active gain region such that said waveguide receives optical energy transmitted through the lens and transmits an optical output beam, wherein said active region has a tapered shape that increases in width along a propagation axis, said lens being located at a point along said propagation axis at which said width of the active gain region is a maximum, said waveguide being located on a side of said active region remote from said lens.

* * * * *